United States Patent
Willey et al.

(10) Patent No.: US 12,154,656 B2
(45) Date of Patent: Nov. 26, 2024

(54) ERROR PIN TRAINING WITH GRAPHICS DDR MEMORY

(71) Applicant: Advanced Micro Devices, Inc., Santa Clara, CA (US)

(72) Inventors: Aaron D Willey, Hayward, CA (US); Karthik Gopalakrishnan, Cupertino, CA (US); Pradeep Jayaraman, San Jose, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 83 days.

(21) Appl. No.: 17/854,213

(22) Filed: Jun. 30, 2022

(65) Prior Publication Data

US 2023/0146703 A1  May 11, 2023

Related U.S. Application Data

(60) Provisional application No. 63/278,321, filed on Nov. 11, 2021.

(51) Int. Cl.
*G11C 7/14* (2006.01)
*G11C 7/10* (2006.01)
*G11C 29/52* (2006.01)

(52) U.S. Cl.
CPC ............. *G11C 7/14* (2013.01); *G11C 7/1045* (2013.01); *G11C 7/1048* (2013.01); *G11C 29/52* (2013.01)

(58) Field of Classification Search
CPC ....................................................... G11C 7/14
USPC ..................................................... 365/185.2
See application file for complete search history.

(56) References Cited

U.S. PATENT DOCUMENTS

| | | | |
|---|---|---|---|
| 2019/0164594 A1 | 5/2019 | Eom et al. | |
| 2020/0242062 A1* | 7/2020 | Lee | G06F 13/4282 |
| 2020/0267032 A1* | 8/2020 | Hollis | G11C 7/1048 |
| 2021/0098039 A1 | 4/2021 | Kim | |
| 2021/0326041 A1 | 10/2021 | Kumar et al. | |
| 2022/0028448 A1* | 1/2022 | Karim | G11C 7/1069 |
| 2022/0238142 A1* | 7/2022 | Suh | G11C 5/147 |
| 2022/0350522 A1* | 11/2022 | Mayer | G11C 7/1057 |

FOREIGN PATENT DOCUMENTS

WO    2021-190298 A1    9/2021

OTHER PUBLICATIONS

International Search Report and Written Opinion for International Application No. PCT/US2022/048247, mailed Feb. 24, 2023, 9 pages.

* cited by examiner

*Primary Examiner* — Muna A Techane
(74) *Attorney, Agent, or Firm* — Polansky & Associates, P.L.L.C.; Paul J. Polansky; Nathan H. Calvert

(57) ABSTRACT

A receiver is trained for receiving a signal over a data bus. A volatile memory is commanded over the data bus to place a selected pulse-amplitude modulation (PAM) driver in a mode with a designated steady output level. At a receiver circuit coupled to the selected PAM driver, a respective reference voltage associated with the designated steady output level is swept through a range of voltages and the respective reference voltage is compared to a voltage received from the PAM driver to determine a respective voltage level received from the PAM driver.

20 Claims, 5 Drawing Sheets

ERROR PIN TRAINING WITH GRAPHICS DDR MEMORY

This application claims priority to provisional application U.S. 63/278,321, filed Nov. 11, 2021, the entire contents of which are incorporated herein by reference.

BACKGROUND

Modern dynamic random-access memory (DRAM) provides high memory bandwidth by increasing the speed of data transmission on the bus connecting the DRAM and one or more data processors, such as graphics processing units (GPUs), central processing units (CPUs), and the like. DRAM is typically inexpensive and high density, thereby enabling large amounts of DRAM to be integrated per device. Most DRAM chips sold today are compatible with various double data rate (DDR) DRAM standards promulgated by the Joint Electron Devices Engineering Council (JEDEC). Typically, several DDR DRAM chips are combined onto a single printed circuit board substrate to form a memory module that can provide not only relatively high speed but also scalability. However, while these enhancements have improved the speed of DDR memory used for computer systems' main memory, further improvements are desirable.

One type of DDR DRAM, known as graphics double data rate (GDDR) memory, has pushed the boundaries of data transmission rates to accommodate the high bandwidth needed for graphics applications. As new GDDR standard are developed, they tend to support higher data rates. However, operating at these higher data rates generally requires improved processes for training the transmission and reception circuitry of the data link. Employing more than two signaling levels on the signaling link also complicates the link training process.

Figure 1:
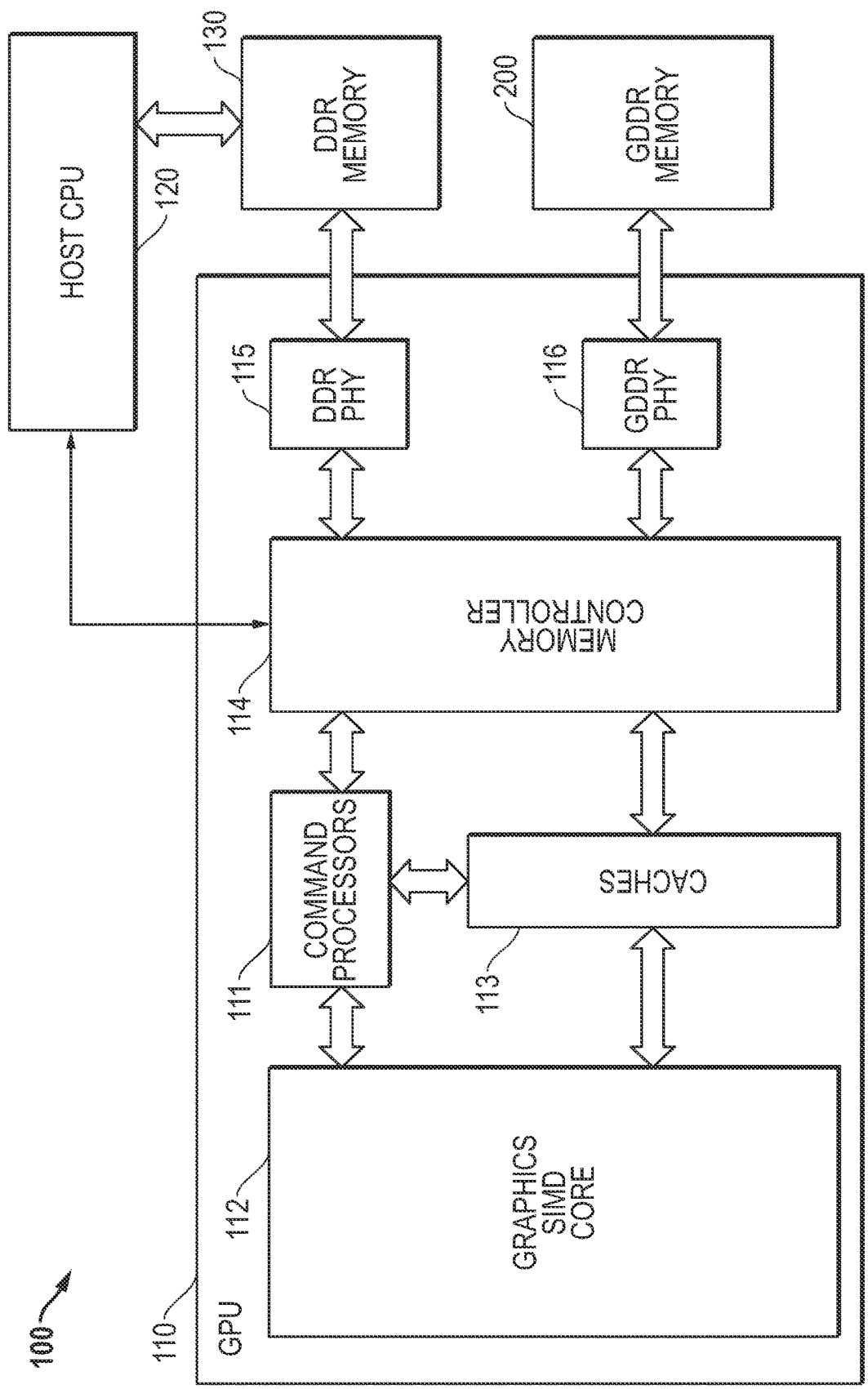
FIG. 1 illustrates in block diagram for a data processing system according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A method is used to train a receiver receiving a signal over a data bus. The method includes commanding a volatile memory over the data bus to place a selected pulse-amplitude modulation 4-level (PAM4) driver in a mode with a designated steady output level, and then waiting for a predetermined period of time. At a receiver circuit coupled to the selected PAM4 driver, the method includes sweeping a respective reference voltage associated with the designated steady output level through a range of voltages and comparing the respective reference voltage to a voltage received from the PAM4 driver to determine a respective voltage level received from the PAM4 driver. The designated steady output level is then changed and the process of sweeping the respective reference voltage and determining a voltage level are repeated for the new output level.

A physical layer (PHY) circuit for coupling to a volatile memory over a data bus includes a pulse-amplitude modulation 4-level (PAM4) receiver and a receiver control circuit. The receiver includes a decoder circuit and three sub-receiver circuits each including an output coupled to the decoder circuit, a first input coupled to a data bus terminal, and a second input coupled to a respective reference voltage circuit. The receiver control circuit is operable to (a) command the volatile memory over the data bus to place a selected PAM4 driver in a mode with a designated steady output level; (b) wait for a predetermined period of time; (c) sweep a reference voltage of a respective one reference voltage circuits through a range of voltages and comparing the reference voltage to a voltage received from the selected PAM4 driver to determine a respective voltage level received from the selected PAM4 driver; and (d) after performing (a)-(c), change the designated steady output level and repeat (a)-(c).

A memory system includes a volatile memory, a data bus coupled to the volatile memory, and a memory controller. The memory controller includes a physical layer (PHY) circuit coupled to the data bus and a receiver control circuit. The PHY circuit includes a pulse-amplitude modulation 4-level (PAM4) receiver including three sub-receiver circuits each including a first input coupled to a data bus terminal and a second input coupled to a respective reference voltage circuit. The receiver control circuit is operable to (a) command the volatile memory over the data bus to place a selected PAM4 driver in a mode with a designated steady output level; (b) wait for a predetermined period of time; (c) sweep a reference voltage of a respective one reference voltage circuits through a range of voltages and comparing the reference voltage to a voltage received from the selected PAM4 driver to determine a respective voltage level received from the selected PAM4 driver; and (d) after performing (a)-(c), change the designated steady output level and repeat (a)-(c).

FIG. 1 illustrates in block diagram for a data processing system 100 according to some embodiments. Data processing system 100 includes generally a data processor in the form of a graphics processing unit (GPU) 110, a host central processing unit (CPU) 120, a double data rate (DDR) memory 130, and a graphics DDR (GDDR) memory 200.

GPU 110 is a discrete graphics processor that has extremely high performance for optimized graphics processing, rendering, and display, but requires a high memory bandwidth for performing these tasks. GPU 110 includes generally a set of command processors 111, a graphics single instruction, multiple data (SIMD) core 112, a set of caches 113, a memory controller 114, a DDR physical interface circuit (DDR PHY) 115, and a GDDR PHY 116. While a GPU is shown in this implementation, GPU 110 may be one of a variety of data processing elements such as a machine-learning parallel accelerated processor.

Command processors 111 are used to interpret high-level graphics instructions such as those specified in the OpenGL programming language. Command processors 111 have a bidirectional connection to memory controller 114 for receiving high-level graphics instructions such as OpenGL instructions, a bidirectional connection to caches 113, and a bidirectional connection to graphics SIMD core 112. In response to receiving the high-level instructions, command processors issue low-level instructions for rendering, geometric processing, shading, and rasterizing of data, such as frame data, using caches 113 as temporary storage. In response to the graphics instructions, graphics SIMD core 112 performs low-level instructions on a large data set in a massively parallel fashion. Command processors 111 and caches 113 are used for temporary storage of input data and output (e.g., rendered and rasterized) data. Caches 113 also have a bidirectional connection to graphics SIMD core 112, and a bidirectional connection to memory controller 114.

Memory controller 114 has a first upstream bidirectional port connected to command processors 111, a second upstream bidirectional port connected to caches 113, a first downstream bidirectional port to DDR PHY 115, and a second downstream bidirectional port to GDDR PHY 116. As used herein, "upstream" ports are on a side of a circuit toward a data processor and away from a memory, and "downstream" ports are in a direction away from the data processor and toward a memory. Memory controller 114 controls the timing and sequencing of data transfers to and from DDR memory 130 and GDDR memory 200. DDR and GDDR memory have asymmetric accesses, that is, accesses to open pages in the memory are faster than accesses to closed pages. Memory controller 114 stores memory access commands and processes them out-of-order for efficiency by, e.g., favoring accesses to open pages, while observing certain quality-of-service objectives.

DDR PHY 115 has an upstream bidirectional port connected to the first downstream port of memory controller 114, and a downstream port bidirectionally connected to DDR memory 130. DDR PHY 115 meets all specified timing parameters of the version of DDR memory 130, such as DDR version five (DDR5), and performs timing calibration operations at the direction of memory controller 114. Likewise, GDDR PHY 116 has an upstream port connected to the second downstream port of memory controller 114, and a downstream port bidirectionally connected to GDDR memory 200. GDDR PHY 116 meets all specified timing parameters of the version of GDDR memory 200, and performs timing calibration operations at the direction of memory controller 114. GDDR memory 200 includes a set of mode registers 141 programmable over the GDDR PHY 116 to configure GDDR memory 200 for operation.

In operation, data processing system can be used as a graphics card or accelerator because of the high bandwidth graphics processing performed by graphics SIMD core 112. Host CPU 120, running an operating system or an application program, sends graphics processing commands to GPU 110 through DDR memory 130, which serves as a unified memory for GPU 110 and host CPU 120. It may send the commands using, for example, as OpenGL commands, or through any other host CPU to GPU interface. OpenGL is a cross-language, cross-platform application programming interface for rendering 2D and 3D vector graphics. Host CPU 120 uses an application programming interface (API) to interact with GPU 110 to provide hardware-accelerated rendering.

Data processing system 100 uses two types of memory. The first type of memory is DDR memory 130, and is accessible by both GPU 110 and host CPU 120. As part of the high performance of graphics SIMD core 112, GPU 110 uses a high-speed graphics double data rate (GDDR) memory.

Figure 2:
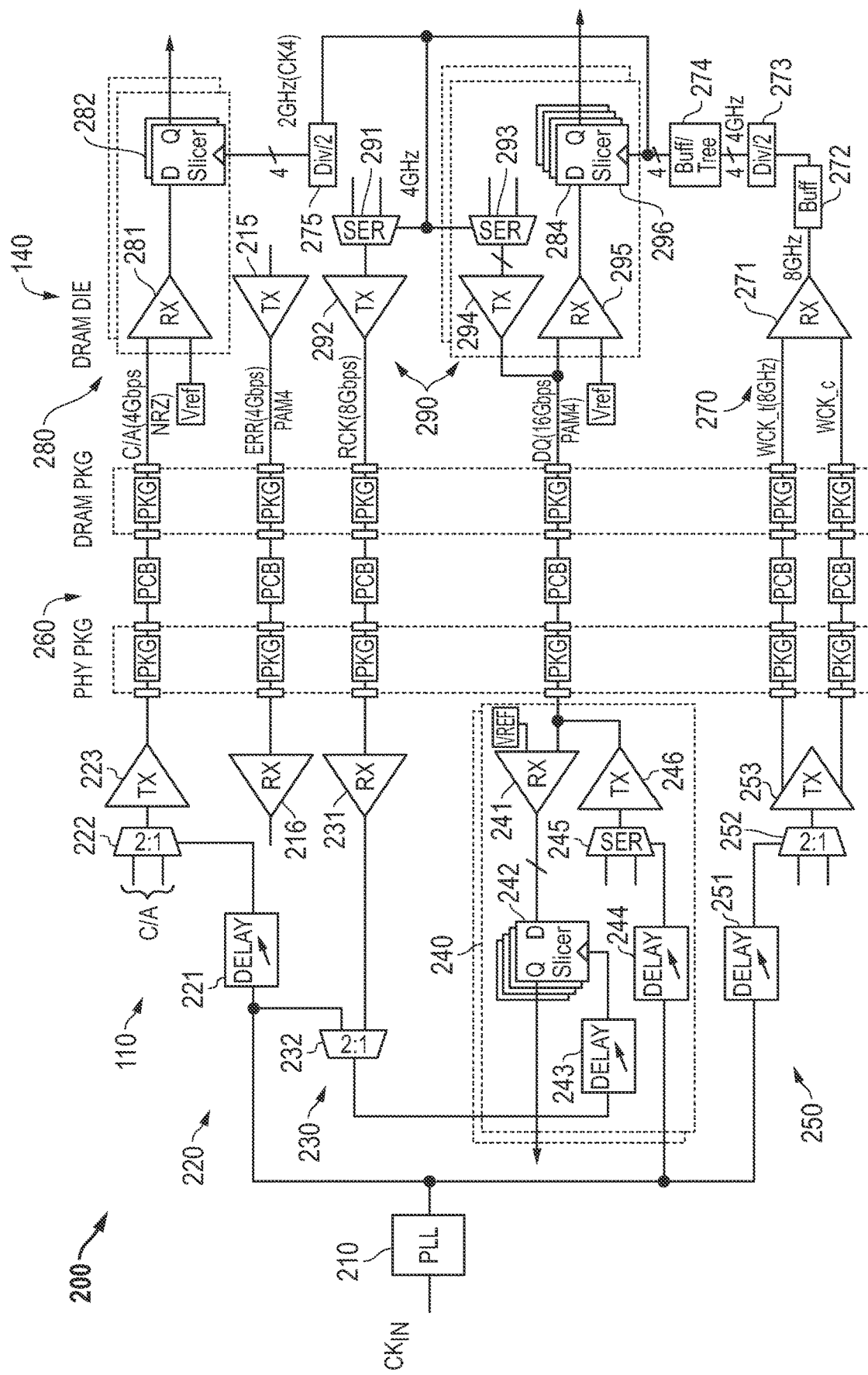
FIG. 2 illustrates in block diagram form a GDDR PHY-DRAM link of the data processing system of FIG. 1.

FIG. 2 illustrates in block diagram form a GDDR PHY-DRAM link 200 of data processing system 100 of FIG. 1 according to some embodiments. GDDR PHY-DRAM link 200 includes portions of GPU 110 and GDDR memory 200 that communicate over a physical interface 260.

GPU 110 includes a phase locked loop (PLL) 210, a command and address ("C/A") circuit 220, a read clock circuit 230, a data circuit 240, and a write clock circuit 250. These circuits form part of GDDR PHY 116 of GPU 110.

Phase locked loop 210 operates as a reference clock generation circuit and has an input for receiving an input clock signal labelled "$CK_{IN}$", and an output.

C/A circuit 220 includes a delay element 221, a selector 222, and a transmit buffer 223 labelled "TX", and an "ERR" receiver 216. Delay element 221 has an input connected to the output of PLL 210, and an output, and has a variable delay controlled by an input, not specifically shown in FIG. 2. The variable delay is determined at startup by memory controller 115 and adjusted during operation by a compensation circuit. Selector 222 has a first input for receiving a first command/address value, a second input for receiving a second command/address value, and a control input connected to the output of delay element 221. Transmitter 223 has an input connected to the output of selector 222, and an output connected to a corresponding integrated circuit terminal for providing a command/address signal labelled "C/A" thereto. Note that C/A circuit 220 includes a set of individual buffers for each signal in the C/A signal group that are constructed the same as the representative selector 222 and buffer 223 shown in FIG. 2, but only a representative C/A circuit 220 is shown.

Read clock circuit 230 include a receive buffer 231 labelled "RX", and a selector 232. Receive buffer 231 has an input connected to a corresponding integrated circuit terminal for receiving a signal labelled "RCK", and an output. Receive clock selector 232 has a first input for connected to the output of PLL 210, a second input connected to the output of receive buffer 231, an output, and a control input for receiving a mode signal, not shown in FIG. 2.

Data circuit 240 includes a receive buffer 241, a latch 242, delay elements 243 and 244, a serializer 245, and a transmit buffer 246. Receive buffer 241 has a first input connected to an integrated circuit terminal that receives a data signal labelled generically as "DQ", a second input for receiving a reference voltage labelled "$V_{REF}$", and an output. Latch 242 is a D-type latch having an input labelled "D" connected to the output of receive buffer 241, a clock input, and an output labelled "Q" for providing an output data signal. The interface between GDDR PHY 116 and GDDR memory 200 implements a four-level, pulse amplitude modulation data signaling system known as "PAM4", which encodes two data bits into one of four nominal voltage levels. Thus, receive buffer 241 discriminates which of the four levels is indicated by the input voltage, and outputs two data bits to represent the state in response. For example, receive buffer 241 could generate three slicing levels based on $V_{REF}$ defining four ranges of voltages, and use three comparators to determine which range the received data signal falls in. Data circuit 240 includes latches which latch the two data bits and is replicated for each bit position. Delay element 243 has an input connected to the output of selector 232, and an output connected to the clock input of latch 242. Delay element 244 has an input connected to the output of PLL 210, and an output. Serializer 245 has inputs for receiving a first data value of a given bit position and a second data value of the given bit position, the first and second data values corresponding to sequential cycles of a burst, a control input connected to the output of delay element 244, and an output connected to the corresponding DR terminal. Each data byte of the data bus has a set of data circuits like data circuit 240 for each bit of the byte. This replication allows different data bytes that have different routing on the printed circuit board to have different delay values.

Write clock circuit 250 includes a delay element 251, a selector 252, and a transmit buffer 253. Delay element 251 has an input connected to the output of PLL 210, and an output. Selector 252 has a first input for receiving a first clock state signal, a second input for receiving a second clock voltage, a control input connected to the output of delay element 251, and an output. Transmit buffer 253 has an input connected to the output of selector 252, and an output a first output connected to a corresponding integrated circuit terminal for providing a true write clock signal labelled "WCK_t" thereto, and a second output connected to a corresponding integrated circuit terminal for providing a complement write clock signal labelled "WCK_c" thereto.

GDDR memory 200 includes generally a write clock receiver 270, a command/address receiver 280, and a data path transceiver 290. Write clock receiver 270 includes a receive buffer 271, a buffer 272, a divider 273, a buffer/tree 274, and a divider 275. Receive buffer 271 has a first input connected to an integrated circuit terminal of GDDR memory 200 that receives the WCK_t signal, a second input connected to an integrated circuit terminal of GDDR memory 200 that receives the WCK_c signal, and an output. In the example shown in FIG. 2, the output of receive buffer 271 is clock signal having a nominal frequency of 8 GHz. Buffer 272 has an input connected to the output of receive buffer 271, and an output. Divider 273 has an input connected the output of buffer 272, and an output for providing a divided clock having a nominal frequency of 4 GHz. Divider 275 has an input for connected to the output of buffer/tree 274, and an output for providing a clock signal labelled "CK4" having a nominal frequency of 2 GHz.

Command/address receiver 280 includes a receive buffer 281 and a slicer 282. Receive buffer 281 has a first input connected to a corresponding integrated circuit terminal of GDDR memory 200 that receives the C/A signal, a second input for receiving $V_{REF}$, and an output. The C/A input signal is received as a normal binary signal having two logic states levels and is considered a non-return-to-zero (NRZ) signal encoding. Slicer 282 has a set of two data latches each having a D input connected to the output of receive buffer 281, a clock input for receiving a corresponding one of the output of divider 275, and a Q output for providing a corresponding C/A signal. A PAM4 driver 215 is also included, labelled "ERR", for providing Command and Address (CA) parity and Write CRC information as further discussed below.

Data path transceiver 290 includes a serializer 291, a transmitter 292, a serializer 293, a transmitter 294, a receive buffer 295, and a slicer 296. Serializer 291 has an input for receiving a first read clock level, a second input for receiving a second read clock level, a select input connected to the output of buffer/tree 274, and an output. Transmitter 292 has an input connected to the output of serializer 293, and an output connected to the RCK terminal of GDDR memory 200. Serializer 293 has an input for receiving a first read data value, a second input for receiving a second data value, a select input connected to the output of buffer/tree 274, and an output connected to the DQ terminal of GDDR memory 200. Transmitter 294 has an input connected to the output of serializer 293, and an output connected to the corresponding DQ terminal of GDDR memory 200. Receive buffer 295 has a first input connected to the corresponding DQ terminal of GDDR memory 200, a second input for receiving the $V_{REF}$ value, and an output. Slicer 296 has a set of four data latches each having a D input connected to the output of receive buffer 295, a clock input connected to the output of buffer/tree 274, and a Q output for providing a corresponding DQ signal.

Interface 260 includes a set of physical connections that are routed between a bond pad of the GPU 110 die, through a package impedance to a package terminal, through a trace on a printed circuit board, to a package terminal of GDDR memory 200, through a package impedance, and to a bond pad of the GDDR memory 200 die.

Figure 3:
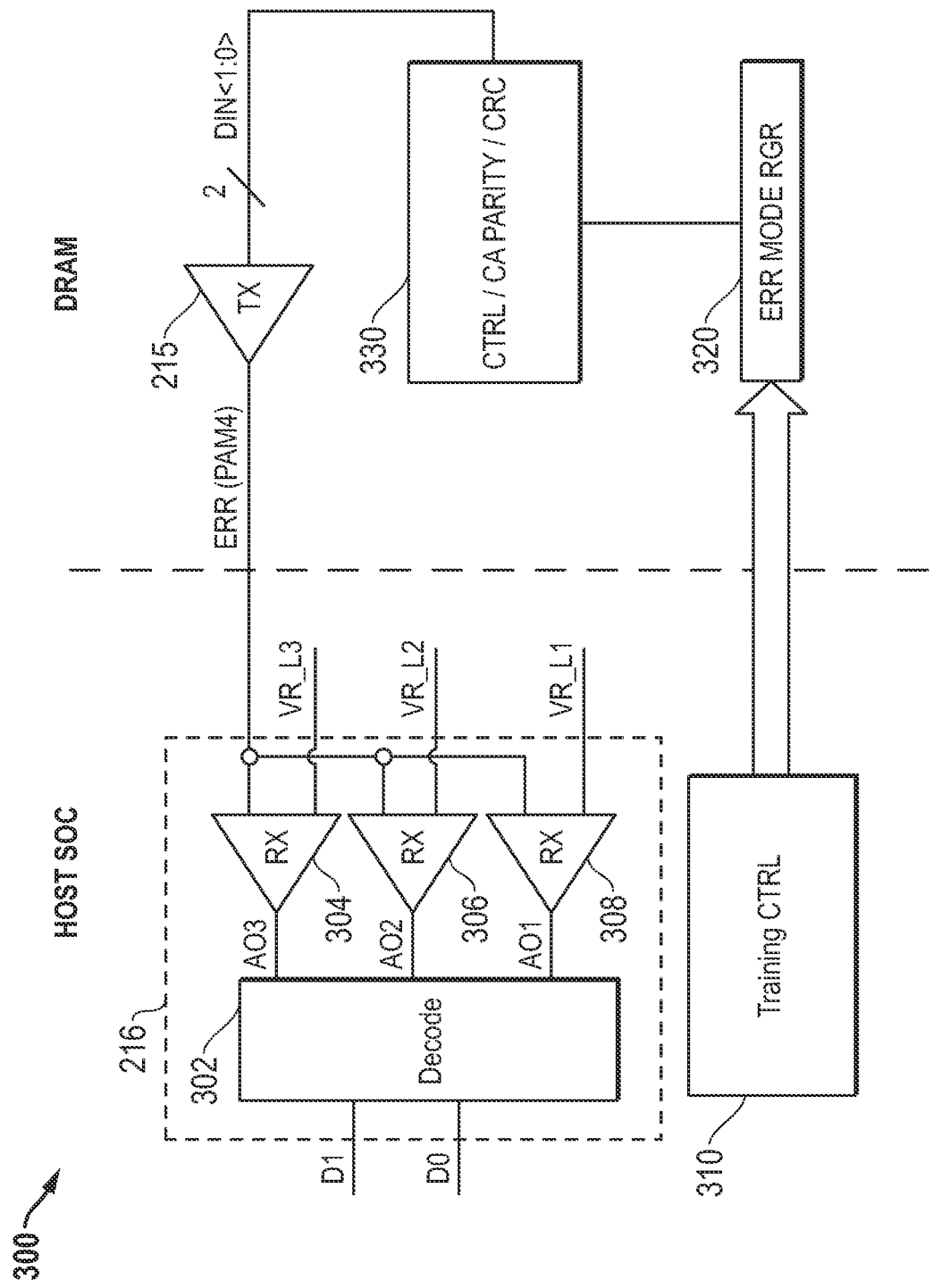
FIG. 3 illustrates in block diagram form a read clock circuit for selectively providing a read clock signal from a memory to a memory controller over a memory bus according to some embodiments.

FIG. 3 illustrates in block diagram form portion of a memory system 300 depicting a part of a physical layer (PHY) circuit on a system-on-chip (SOC) and associated circuitry on a DRAM according to some embodiments. The depicted portion of memory system 300 includes PAM4 driver 215, PAM4 receiver 216, a training control circuit 310, an error mode register 320, and a control, command/address parity, and cyclic-redundancy check circuit 330 labelled "CTRL/CA PARITY/CRC".

While a PAM4 driver is shown in this implementation, the techniques herein are applicable to PAM signaling with three or more PAM levels, for example, PAM3, PAM4, PAM6, and PAM8 drivers and receivers.

The depicted portion of memory system 300 is suitable for use with a DRAM compliant with the GDDR memories employing multi-level PAM signaling, such as the depicted GDDR PHY-DRAM link shown in FIG. 2. PAM4 driver 215, in this implementation, drives a signal onto the "ERR" pin of a GDDR PHY, over the memory bus to the host SOC. PAM4 driver 215 has an input receiving a 2-bit signal labelled "DIN<1:0>", and an output connected to the ERR pin labelled "ERR (PAM4)". The ERR pin carries a PAM4 signal asynchronously driven by the GDDR DRAM to the host system-on-chip (SOC), communicating command and Address (CA) parity and Write CRC information provided by CTRL/CA PARITY/CRC circuit 330 to the host SOC.

PAM4 receiver 216 is part of the host SOC's PHY circuit for coupling to the DRAM. PAM4 receiver 216 has an input connected to ERR pin of the PHY, a second input receiving a reference voltage "VR_L3", a third input receiving a reference voltage "VR_L2", and a fourth input receiving a reference voltage "VR_L1". PAM4 receiver 216 includes a Decoder circuit 302 having three inputs labelled "A01", "A02", and "A03", and three sub-receiver circuits 304, 306, and 308, each including an output coupled to a respective input of decoder circuit 302, a first input connected to the first input of PAM4 receiver 216, and a second input connected to receive a respective one of reference voltages VR_L3, VR_L2, and VR_L1. Each sub-receiver is implemented as a voltage comparator which compares the reference voltage at its input to the voltage received over the ERR pin and outputs a "1" if the ERR voltage is higher than the reference voltage, and a "0" if the ERR voltage is lower than the reference voltage.

While the PAM4 scheme allows the data transmission bandwidth to be doubled for a given clock speed, it makes training of the various bit lanes of the PHY more difficult than training prior PHY bit lanes which employed two signaling levels. Training for the various DQ drivers and receivers employed in GDDR PHY 116 (e.g., FIG. 2, 241, 246, 294, 295) is therefore lengthier and more complex than training for GDDR PHYs that interface with two-level signaling. Training control circuit 310 includes digital logic for controlling a simplified PAM training process for PAM4 driver 215 and PAM4 receiver 216. Training control circuit 310 includes connections to the PHY digital control logic (not shown), and a communicative connection to error mode register 320 on the DRAM, in this implementation through a mode register set (MRS) command interface.

Error mode register 320 on the DRAM is able to be programmed with MRS programming commands through the GDDR command interface, and generally holds values for controlling the operating mode of CTRL/CA PARITY/CRC circuit 330 and its associated PAM4 driver 215. CTRL/CA PARITY/CRC circuit 330 has inputs connected to error mode register 320, inputs (not shown) for receiving the control and CA data from which to produce parity and CRC information, and an output connected to PAM4 driver 215 for providing the DIN<1:0>signal.

In operation, PAM4 receiver 216 receives data asynchronously, that is, the data is received in an asynchronous manner without reference to RCK. In this implementation, PAM4 driver 215 transmits data at a rate of 4 Gbps, a lower rate than that used for the DQ lines of GDDR PHY 116. The link training for PAM4 receiver 216 is therefore provided in a more efficient and simplified version than that employed for the DQ lines. Training control circuit 310 programs error mode register 320 to place CTRL/CA PARITY/CRC circuit 330 into various modes for conducting a simplified training process, as further described with respect to FIG. 4. In this implementation, the following ERR-related mode register states are available to be selected by training control circuit 310: a Normal mode (in which CTRL/CA PARITY/CRC circuit 330 operates normally to provide parity information), a Force "00" mode, a Force "01", Force "10", and a Force "11" mode. In the Force modes, the value of DIN<1:0>, and therefore the value driven by PAM4 driver 215, is forced to a constant value representing one of the PAM levels which PAM4 driver 215 is capable of driving.

Figure 4:
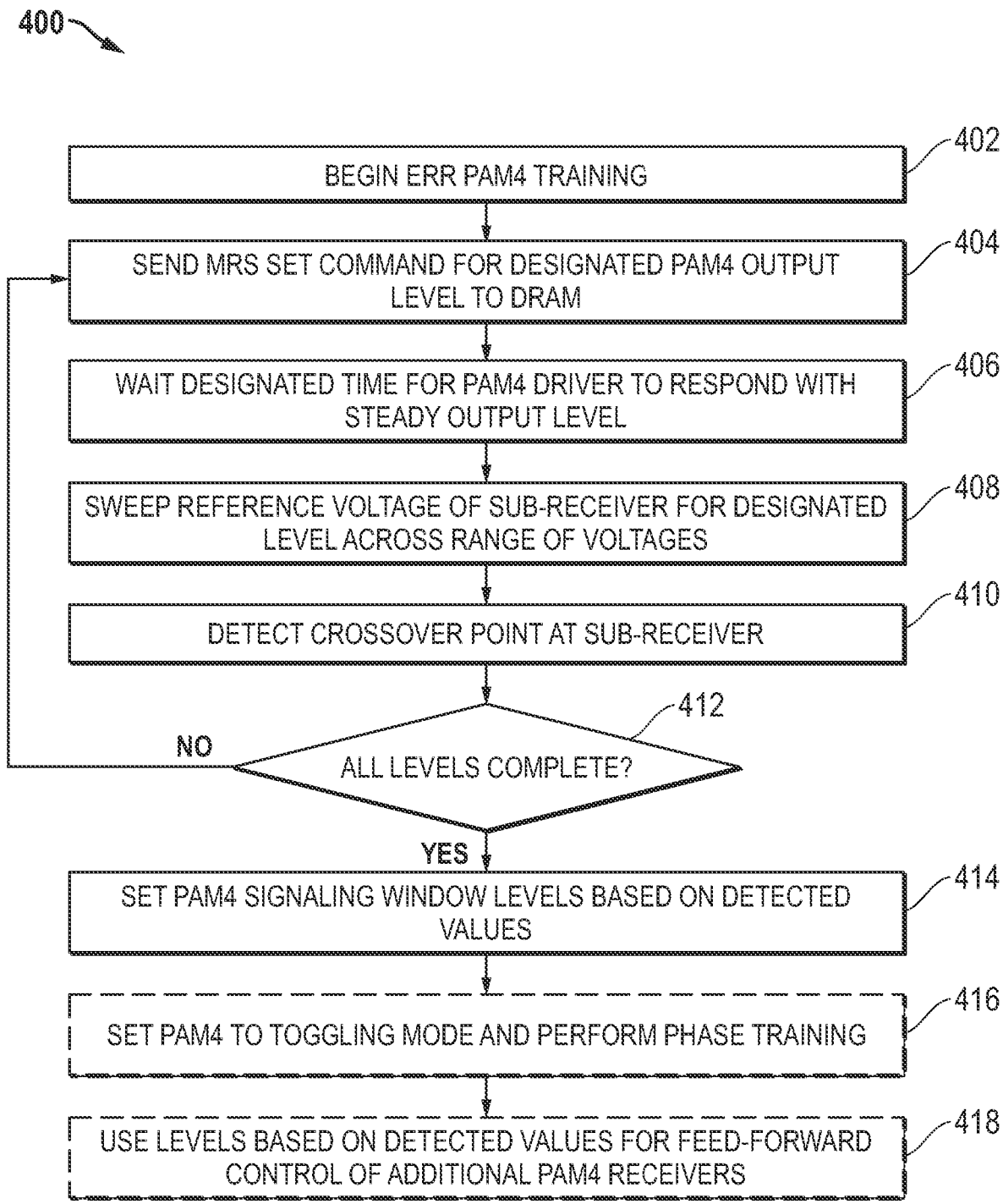
FIG. 4 shows a flow chart of a process for training a PAM4 receiver according to some embodiments.
Figure 5:
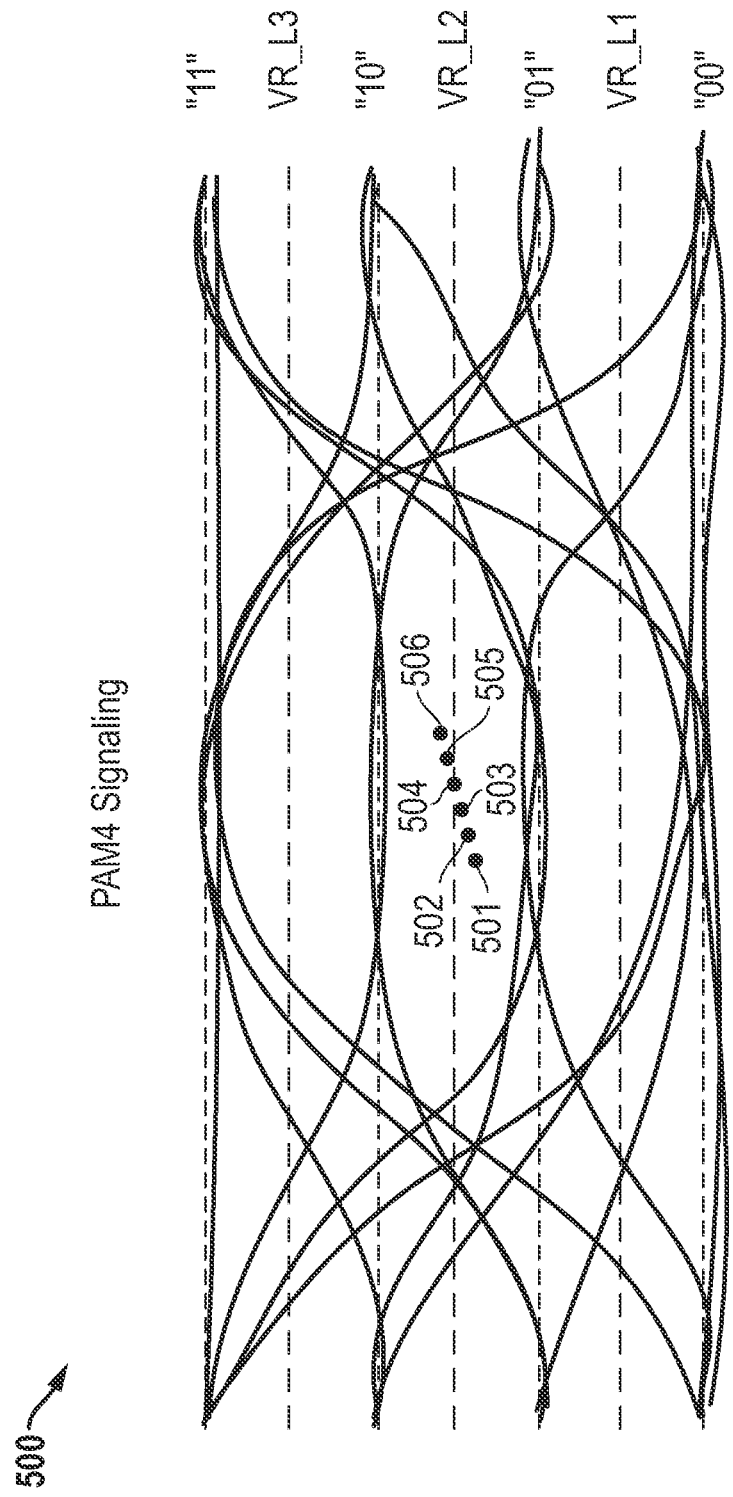
FIG. 5 illustrates in "eye" diagram form various signaling levels that may be employed with the process of FIG. 4.

FIG. 4 shows a flow chart 400 of a process for training a PAM4 receiver according to some embodiments. FIG. 5 shows an "eye" diagram 500 illustrating various signaling levels that may be employed with the process of FIG. 4. Referring to both FIG. 4 and FIG. 5, the process illustrated in flow chart 400 is suitable for use with various GDDR PHY circuits, such as those depicted in FIG. 2 and FIG. 3, for conducting a simplified training process for a PAM4 receiver such as PAM4 receiver 216 to be trained to receive signals from a DRAM or other volatile memory.

Generally, the process has the advantage of reducing ERR pin training complexity, for example training conducted during system boot or a reset of the DRAM PHY. While ideally, the system would avoid training the ERR pin altogether, such an approach is often not practical due to process, voltage, and temperature variations associated with the driver and receiver circuits of the PHY. The depicted process has the advantage of providing a low-cost training method that is both simple to implement and operates quickly as compared to a typical PAM4 receiver training process. The depicted process generally employs DC levels driven by the DRAM device on the ERR pin to train the host ERR receiver reference voltage (VREF) levels.

The process begins training the receiver for the ERR pin at block 402. In this example, as shown, a PAM4 receiver is employed, but a similar process may be used with other types of PAM receivers such as, for example, a PAM6 or PAM8 receiver.

At block 404, a receiver control circuit such as training control circuit 310 (FIG. 3) commands the DRAM over the data bus to place a selected PAM4 driver in a mode with a designated steady output level. In this implementation, an MRS command such as Force "01" is stored to error mode register 320 to command CTRL/CA PARITY/CRC circuit 330 to set the designated output level. In other implementations, another method of achieving a designated DC output level can be used, such as, for example, sending a training pattern of bits with repeated values for the desired steady DC output level. Referring to block 404, the MRS command can be issued at any time before, after, or during Command Address (CA) training on the PHY. During this training time, host ERR termination is preferably applied to ensure proper reference signal levels.

Then, at block 406, the process waits for a predetermined period of time. After this waiting period, the DRAM will be assumed to have placed the ERR pin into the designated DC state with the commanded DC output level driven by the PAM4 driver such as PAM4 driver 215. The DC output levels of the PAM4 driver are depicted in FIG. 5 labelled "00", "01", "10", and "11".

At block 408, the process then sweeps a reference voltage of a respective one of the reference voltage circuits providing voltages VR_L1, VR_L2, and VR_L3 by successively changing the voltage through a range of voltages and comparing the reference voltage to a voltage received from the selected PAM4 driver after each change to determine a respective voltage level received from the selected PAM4 driver. In this implementation, determining the particular voltage level received, as shown at block 410, is done by respective ones of multiple sub-receiver circuits of the PAM4 receiver, for example sub-receivers 304, 306, and 308. As the reference voltage passes the received voltage at a selected one of the sub-receivers, the sub-receiver changes the value received from low to high (if the reference voltage is swept upward) or from high to low (if the reference voltage is swept downward). This detected crossover point is saved in order to properly set all reference voltages VR_L1, VR_L2, and VR_L3 at block 414.

As shown at block 412, the process is be repeated for all PAM levels, but in other implementations, it need not be repeated for all levels. For example, block 412 may instead repeat the process designated subset of PAM levels. For example, levels "01", "10", and "11" may be trained by repeating blocks 404 through 410, and level "00" may be assumed to be zero volts.

At block 414, the reference voltage levels for continued operation of the PAM4 receiver are set based on the crossover points detected at block 410. Preferably, the reference voltages are selected as the average of the two surrounding crossover points, but other selection methods may be used. These settings establish a "window" for the range of voltage levels in which a particular value will be recognized as being received by the PAM4 receiver.

In an exemplary scenario in which PAM4 receiver 216 (FIG. 3) is trained, a Force "11" command is loaded to error mode register 320, causing PAM4 driver 215 to output the "11" level, the highest level shown in FIG. 5. Then the reference voltage VR_L3 is altered at a designated pace starting at a designated level such as the typical level depicted in FIG. 5, by increasing the voltage level of VR_L3 until sub-receiver 304 changes from outputting a "1" to outputting a "0", indicating that VR_L3 has crossed the actual voltage level received on the ERR pin. Then a Force "10" command is loaded, causing PAM4 driver 215 to output the "10" level, and VR_L2 is similarly swept up from a designated value until sub-receiver 306 detects a crossover. An example of sweeping the voltage level of reference voltage VR_L2 is depicted in FIG. 5, which shows six different voltage levels 501, 502, 503, 504, 505, and 506 through which VR_L2 is changed. While voltage levels 501-506 are depicted spread over time during the eye, this depiction is to better illustrate the voltage levels, and the actual timing of reference voltage changes and measurements varies in different implementations. For example, in one implementation, the measurement is made at the same point in the eye. In another implementation, the measurements are made as fast as the reference voltage can be altered and the output of the sub-receiver circuits can be recognized. At each voltage level, the process compares the reference voltage to the voltage received over the PAM4 driver to determine if it is higher or lower. In this embodiment, the comparison is performed with the respective sub-receiver circuit (e.g. 306, FIG. 3) for the reference voltage. When the sub-receiver circuit output transitions from LOW to HIGH, the process has detected that the reference voltage being swept has become higher than the received voltage. While six voltage levels are shown, generally more will be used, spaced at a suitable voltage interval to detect the received voltage level at a resolution suitable for use with the receiver. For example, the voltage levels may increase with each alteration at the smallest increase provided by the reference voltage generation circuit, or a selected voltage increase larger than the smallest available increase.

Then a Force "01" command is loaded, causing PAM4 driver 215 to output the "01" level, and VR_L1 is swept upward until sub-receiver 308 detects a crossover. Finally, a Force "00" command may also be included, for which VR_L1 is swept downward until a crossover is detected. For a downward sweep, the crossover point is detected by the respective sub-receiver circuit's output transitioning from HIGH to LOW, indicating that the reference voltage being swept has become lower than the received voltage. It can be understood that for the "01" and "10" levels, a downward sweep of the reference voltage above the designated level may be used rather than an upward sweep of the reference voltage below the designated level.

As shown at block 416, after the reference levels are set, another optional step in the training is to enable a mode register setting in the DRAM device to set the ERR pin into toggle mode for performing phase training. In such a process, the center of the "eye" as shown in FIG. 5 is adjusted by adjusting the phase delay or advance at which the PAM4 receiver value is measured until optimal values are received. In block 416, the ERR pin can be configured to cycle through all or a subset of the 4-levels at the expected toggle frequency of the ERR pin in normal operation in order to phase train each respective opening in the eye diagram. In some implementations, such phase training is useful under certain modes of operation.

As shown at block 418, another optional step is to provide the reference voltage levels determined at block 414 for use by other PAM4 receivers in the PHY circuit based on the efficient level-training process conducted at blocks 404 through 414. For example, block 418 may include providing the determined reference voltage levels for VR_L1, VR_L2, and VR_L3 to the training process for the DQ receivers (e.g., 241, FIG. 2) purposes such as DQ VREF level adaption or for providing an initial VREF level setting for use in training or operating the DQ receivers.

An integrated circuit or integrated circuits containing the reference voltage generation circuits described herein, or any portions thereof, may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, various PAM4 driver designs may be used with different numbers of PAM levels. Further, various ways of commanding the PAM4 driver to transmit the desired steady values for the efficient training process may be used. The disclosed technique is applicable to a wide variety of integrated circuits that use high-speed data transmission. In one particular example, one integrated circuit can be a data processor, system-on-chip (SOC), or graphics processing unit (GPU), while the other integrated circuit is a DDR or GDDR SDRAM, but the techniques described herein can be used with many other types of integrated circuits. The transmission medium can also vary between embodiments depending on the physical construction of the memory bus, and may include printed circuit board traces, bond wires, through-silicon vias (TSVs), and the like.

Accordingly, it is intended by the appended claims to cover all modifications of the disclosed embodiments that fall within the scope of the disclosed embodiments.

What is claimed is:

1. A method for training a receiver, comprising:
   commanding a volatile memory over a data bus to place a selected pulse-amplitude modulation (PAM) driver operating with at least three PAM levels in a mode with a designated steady output level; and
   at a receiver circuit coupled to the selected PAM driver, while the selected PAM driver is in the mode with the designated steady output level, sweeping a respective reference voltage associated with the designated steady output level through a range of voltages and comparing the respective reference voltage to a voltage received from the PAM driver to determine a respective voltage level received from the PAM driver.

2. The method of claim 1, further comprising:
   commanding the selected PAM driver to toggle at an expected rate of operation through one of (i) all of its output levels and (ii) a subset of its output levels; and
   while the selected PAM driver is toggling, performing phase training of the receiver circuit.

3. The method of claim 1, further comprising:
   commanding the volatile memory to place the selected PAM driver in a mode with a second designated steady output level; and
   at the receiver circuit coupled to the selected PAM driver, while the PAM driver is in the mode with the second designated steady output level, sweeping a second respective reference voltage associated with the second designated steady output level through a second range of voltages and comparing the second respective reference voltage to a voltage received from the PAM driver to determine a second respective voltage level received from the PAM driver.

4. The method of claim 3, further comprising:
setting an initial level for two reference voltages associated with an additional PAM receiver coupled to the volatile memory based on a respective voltage level and the second respective voltage level, respectively.

5. The method of claim 4, wherein:
the selected PAM driver is connected to a designated output terminal of the volatile memory providing Command and Address (CA) parity and Write cyclic- redundancy check (CRC) information to a host; and
commanding the volatile memory over the data bus is performed by issuing a mode register set (MRS) command to the volatile memory.

6. The method of claim 5, wherein:
the additional PAM receiver is a receiver for a data input-output (DQ) terminal of the data bus.

7. The method of claim 1, wherein:
sweeping the respective reference voltage associated with the designated steady output level through the range of voltages further comprises selecting one of at least two sub-receiver circuits and sweeping a reference voltage coupled to the selected one of the at least two sub-receiver circuits.

8. A physical layer (PHY) circuit for coupling to a volatile memory over a data bus, comprising:
a pulse-amplitude modulation (PAM) receiver operating with at least three PAM levels and comprising:
a decoder circuit;
at least two sub-receiver circuits each including an output coupled to the decoder circuit, a first input coupled to a data bus terminal, and a second input coupled to a respective reference voltage circuit; and
a receiver control circuit operable to command the volatile memory over the data bus to place a selected PAM driver in a mode with a designated steady output level; and, while the selected PAM driver is in the mode with the designated steady output level, sweep a reference voltage of a respective one of the sub-receiver circuits through a range of voltages and compare the reference voltage to a voltage received from the selected PAM driver to determine a respective voltage level received from the selected PAM driver.

9. The PHY circuit of claim 8, wherein the receiver control circuit is further operable to:
command the selected PAM driver to toggle at an expected rate of operation through one of (i) all of its output levels and (ii) a subset of its output levels; and
while the selected PAM driver is toggling, perform phase training of the PAM receiver.

10. The PHY circuit of claim 8, wherein the receiver control circuit is further operable to:
command the volatile memory over a data bus to place the selected PAM driver in a mode with a second designated steady output level; and
while the PAM driver is in the mode with the second designated steady output level, sweep a second respective reference voltage associated with the second designated steady output level through a second range of voltages and comparing the second respective reference voltage to a voltage received from the PAM driver to determine a second respective voltage level received from the PAM driver.

11. The PHY circuit of claim 10, wherein the receiver control circuit is further operable to:
set an initial level for two reference voltages associated with an additional PAM receiver coupled to the volatile memory based on the respective voltage level and the second respective voltage level, respectively.

12. The PHY circuit of claim 11, wherein:
the selected PAM driver is connected to a designated output terminal of the volatile memory providing Command and Address (CA) parity and Write cyclic-redundancy check (CRC) information to a host; and
commanding the volatile memory over the data bus is performed by issuing a mode register set (MRS) command to the volatile memory.

13. The PHY circuit of claim 12, wherein:
the additional PAM receiver is a receiver for a data input-output (DQ) terminal of the data bus.

14. A memory system, comprising:
a volatile memory;
a data bus coupled to the volatile memory; and
a memory controller comprising a physical layer (PHY) circuit coupled to the data bus and including:
a pulse-amplitude modulation (PAM) receiver operating with at least three PAM levels and including at least two sub-receiver circuits each including a first input coupled to a data bus terminal and a second input coupled to a respective reference voltage circuit; and
a receiver control circuit operable to command the volatile memory over the data bus to place a selected PAM driver in a mode with a designated steady output level; and, while the selected PAM driver is in the mode with the designated steady output level, sweep a reference voltage of a respective one of the sub-receiver circuits through a range of voltages and compare the reference voltage to a voltage received from the selected PAM driver to determine a respective voltage level received from the selected PAM driver.

15. The memory system of claim 14, wherein the receiver control circuit is further operable to:
command the selected PAM driver to toggle at an expected rate of operation through one of (i) all of its output levels and (ii) a subset of its output levels; and
while the selected PAM driver is toggling, perform phase training of the PAM receiver.

16. The memory system of claim 14, wherein the receiver control circuit is further operable to:
command the volatile memory to place the selected PAM driver in a mode with a second designated steady output level; and
while the PAM driver is in the mode with the second designated steady output level, sweep a second respective reference voltage associated with the second designated steady output level through a second range of voltages and compare the second respective reference voltage to a voltage received from the PAM driver to determine a second respective voltage level received from the PAM driver.

17. The memory system of claim 16, wherein the receiver control circuit is further operable to:
set an initial level for two reference voltages associated with an additional PAM receiver coupled to the volatile memory based on the respective voltage level and the second respective voltage level, respectively.

18. The memory system of claim 17, wherein:
the selected PAM driver is connected to a designated output terminal of the volatile memory providing Command and Address (CA) parity and Write cyclic-redundancy check (CRC) information to a host; and
commanding the volatile memory over the data bus is performed by issuing a mode register set (MRS) command to the volatile memory.

19. The memory system of claim 18, wherein:
the additional PAM receiver is a receiver for a data input-output (DQ) terminal of the data bus.

20. The memory system of claim 14, wherein the selected PAM driver of the volatile memory is operable to, responsive to commands from the receiver control circuit, be placed in a number of modes including:
an operating mode in which it provides Command and Address (CA) parity and Write cyclic-redundancy check (CRC) information to the memory controller;
a first mode in which it provides a steady output at a first PAM level;
a second mode in which it provides a steady output at a second PAM level; and
a third mode in which it provides a steady output at a third PAM level.

* * * * *